United States Patent
Zhou et al.

(10) Patent No.: US 8,889,825 B2
(45) Date of Patent: Nov. 18, 2014

(54) CONJUGATED POLYMER CONTAINING ISOINDIGO UNITS, PREPARATION METHOD AND USE THEREOF

(75) Inventors: Mingjie Zhou, Guangdong (CN); Ping Wang, Guangdong (CN); Zhenhua Zhang, Guangdong (CN); Juanjuan Zhang, Guangdong (CN)

(73) Assignee: Ocean's King Lighting Science & Technology, Co., Ltd., Guangdong (CN)

( * ) Notice: Subject to any disclaimer, the term of this patent is extended or adjusted under 35 U.S.C. 154(b) by 0 days.

(21) Appl. No.: 13/884,880

(22) PCT Filed: Nov. 25, 2010

(86) PCT No.: PCT/CN2010/079122
§ 371 (c)(1),
(2), (4) Date: May 10, 2013

(87) PCT Pub. No.: WO2012/068733
PCT Pub. Date: May 31, 2012

(65) Prior Publication Data
US 2013/0220415 A1    Aug. 29, 2013

(51) Int. Cl.
| | | |
|---|---|---|
| C08G 75/00 | (2006.01) | |
| C09K 11/06 | (2006.01) | |
| H01L 31/0256 | (2006.01) | |
| C08G 61/12 | (2006.01) | |
| H01L 51/42 | (2006.01) | |
| H01L 51/00 | (2006.01) | |

(52) U.S. Cl.
CPC ............ *H01L 31/0256* (2013.01); *H01L 51/42* (2013.01); *C09K 11/06* (2013.01); *C08G 2261/3241* (2013.01); *H01L 51/0053* (2013.01); *C08G 2261/1412* (2013.01); *C08G 61/124* (2013.01); *C08G 2261/124* (2013.01); *C08G 2261/91* (2013.01); *C08G 2261/95* (2013.01); *C08G 2261/92* (2013.01); *C08G 2261/592* (2013.01); *H01L 51/0043* (2013.01); *C08G 2261/3246* (2013.01); *C09K 2211/1466* (2013.01); *C08G 2261/3327* (2013.01); *C08G 2261/344* (2013.01); *C08G 2261/413* (2013.01); *C08G 61/12* (2013.01); *C08G 2261/3162* (2013.01); *C08G 61/122* (2013.01)
USPC ........................... 528/377; 528/378; 528/380

(58) Field of Classification Search
USPC .......................................... 528/377, 378, 380
See application file for complete search history.

(56) References Cited

PUBLICATIONS

Salder et al. (Macromolecules, vol. 43, No. 20, 2010).*

*Primary Examiner* — Shane Fang
(74) *Attorney, Agent, or Firm* — Rosenberg, Klein & Lee

(57) ABSTRACT

A conjugated polymer containing isoindigo units is disclosed, which has the following structure: P: formula I; wherein, Ar is formula II, formula III or formula IV; $R^1$ is a $C_8$-$C_{20}$ alkyl; $R^2$ is a $C_1$-$C_{12}$ alkyl; n is an integer of 2-50. The conjugated polymer containing isoindigo units of this type has good solubility and film-forming property, as well as high thermal stability. HOMO and LUMO energy level are regulated effectively; the absorption range is broaden; and the energy conversion efficiency is greatly improved. A preparation method for the above conjugated polymer containing isoindigo units and use thereof in related fields are also provided.

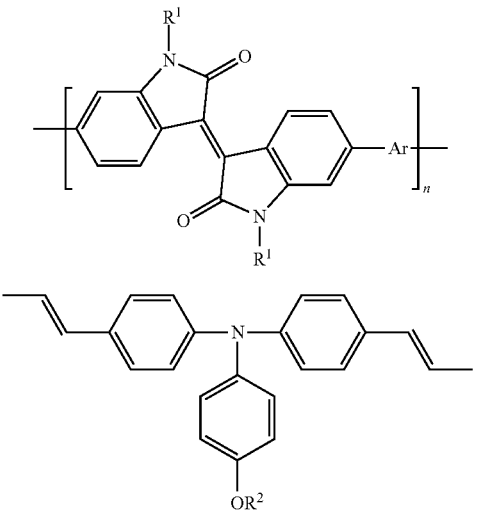
(I)
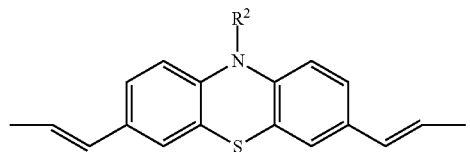
(III)
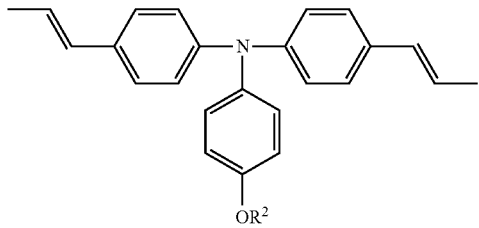
(II)
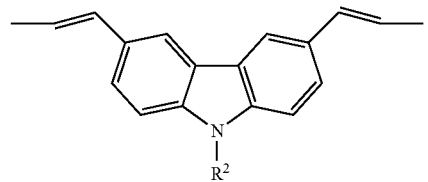
(IV)
8 Claims, 2 Drawing Sheets

CONJUGATED POLYMER CONTAINING ISOINDIGO UNITS, PREPARATION METHOD AND USE THEREOF

FIELD OF THE INVENTION

The present invention relates to the field of optoelectronic, more particular, relates to a conjugated polymer containing isoindigo units, preparation method and use thereof.

BACKGROUND OF THE INVENTION

Energy issues are the serious concern of all countries in the world. Solar energy is the best alternative energy for mankind in the future, how to convert solar energy into electrical power is a hotspot in research. In recent years, conjugated polymer thin film organic solar cells got a substantial development, due to its advantages of low cost, light weight, simple fabrication process, can be prepared into flexible devices, etc. In addition, many kinds of organic materials can be used as the material of the thin film organic solar cells, and strong in design, it is hopeful to improve the performance of the organic solar cells through the design and optimization of materials.

By well design and optimization of the material, it can regulate the absorption spectrum, HOMO level, LUMO level, and transmission properties of conjugated polymers, and these properties play a very important role in spectrum absorption, carrier generation, collection of carriers on the electrode, and current yielding. In the past decade, conjugated polymers with the receptor system has obtained rapid development, it is proved by continuous research that, the receptor system can effectively regulate HOMO and LUMO levels and band gap of the organic semiconductor.

For recent years, the receptor system of small molecules which containing diketopyrrolo[3,4-c]pyrrole (DPP) unit (Walker B., Tomayo A. B., Nguyen T. Q., et al. Adv. Funct. Mater., 2009, 19, 3063), conjugated polymer (Allard N., R. B. Ai"ch, Leclerc M, et al. Macromolecules, 2010, 43, 2328) are frequency reported. the energy conversion efficiency of polymers/PCBM based on DPP and small molecule solar energy cells based on DPP are as high as 4.7% and 4.4%. Both isoindigo and DPP contains central symmetric pyrrolidone nucleus, alkylation reaction on N atom becomes very easy, thus materials containing isoindigo unit is a promising high performance organic solar cells materials. However, materials containing isoindigo unit has few reports so far, which greatly limits its scope of application.

BRIEF DESCRIPTION OF THE DRAWINGS

For this reason, it is necessary to provide a conjugated polymer containing isoindigo units.

Moreover, it is necessary to provide a method of preparation the conjugated polymer containing isoindigo units also.

Figure 1:
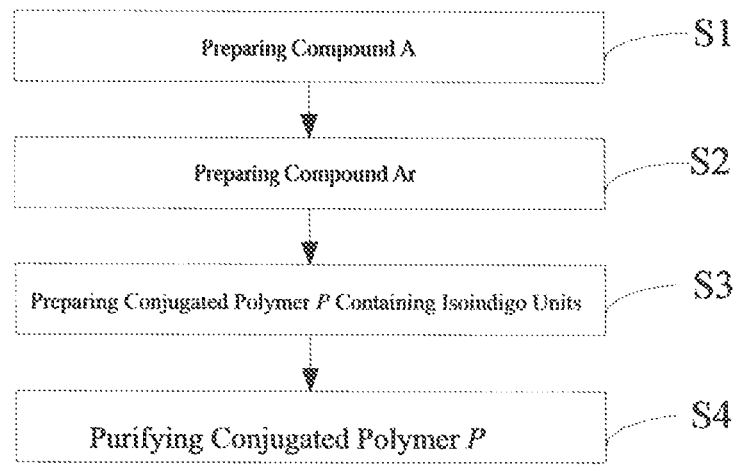

Moreover, it is also necessary to provide an application of conjugated polymer containing isoindigo units in the fields of solar energy cells, organic electroluminescent device, and organic field-effect transistor.

A conjugated polymer containing isoindigo units, having the structural formula as follow:

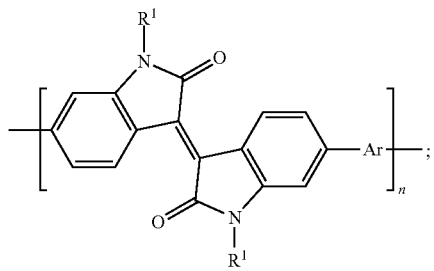

Ar is selected one from the group consisting of

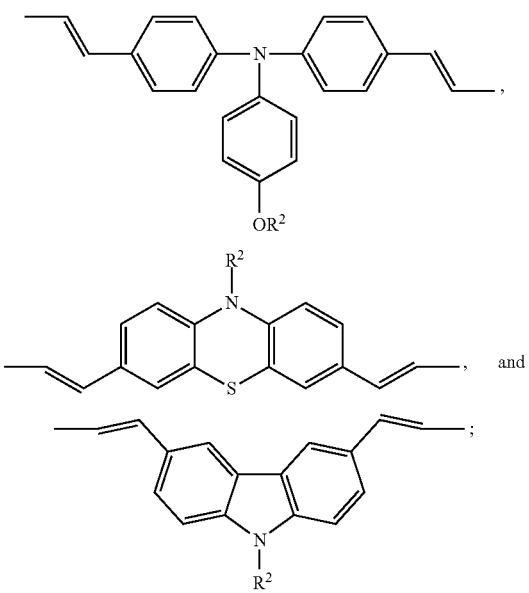

$R^1$ represents $C_8$ to $C_{20}$ alkyl;

$R^2$ represents $C_1$ to $C_{12}$ alkyl;

n represents an integer from 2 to 50.

A method of preparing a conjugated polymer containing isoindigo units, comprising the steps of, providing a compound A with the following structure:

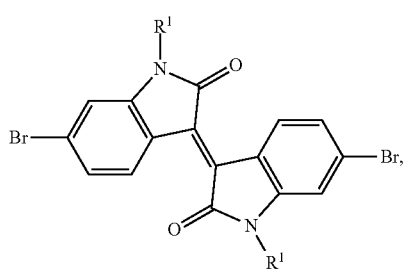

and compound Ar is selected one from the group consisting of

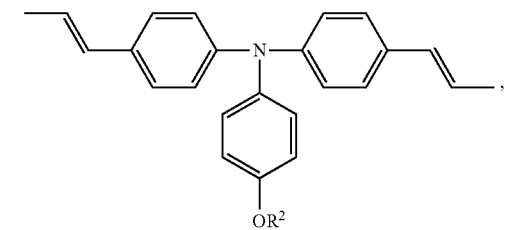

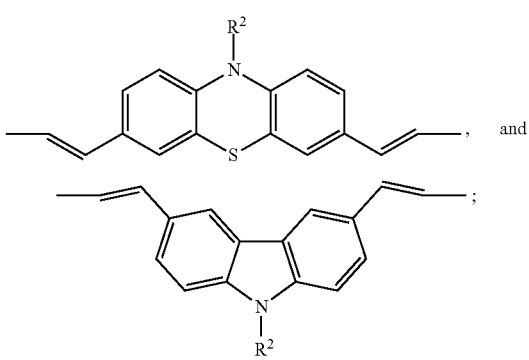

in which $R^1$ represents $C_8$ to $C_{20}$ alkyl, $R^2$ represents $C_1$ to $C_{12}$ alkyl, n represents an integer from 2 to 50;

in an anaerobic environment, applying a mixture of organic palladium and organic phosphine ligand as catalyst, and the molar ratio between the organic palladium and organic phosphine ligand is 1:2 to 1:20; mixing compound A and compound Ar in organic solvent for Heck reaction, then obtaining a conjugated polymers containing isoindigo units with the following structural formula:

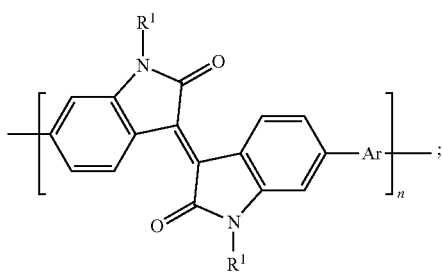

wherein, Ar is selected one from the group consisting of

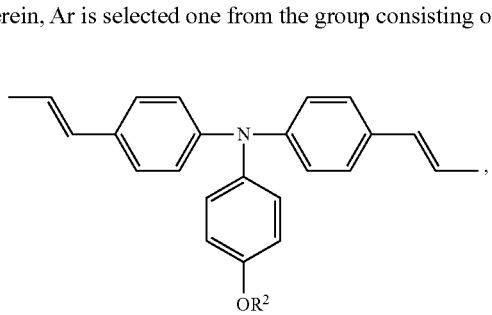

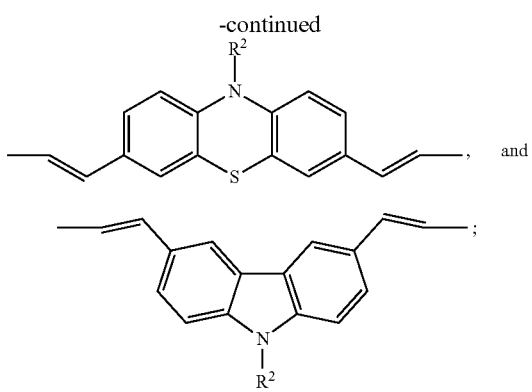

$R^1$ represents $C_8$ to $C_{20}$ alkyl; $R^2$ represents $C_1$ to $C_{12}$ alkyl; n represents an integer from 2 to 50;

the reaction equation is:

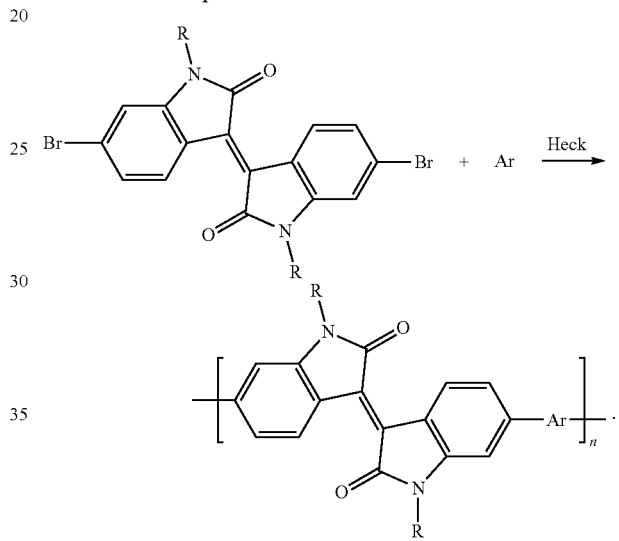

Preferably, the organic solvent is a mixture of N,N-dimethyl formamide and triethylamine, the organic palladium is palladium acetate, and the organic phosphine ligand is P(o-Tol)$_3$.

Preferably, the condition of Heck reaction is at temperature from 90° C. to 110° C. and reacting for 48~72 hours.

Preferably, the compound A is prepared by the following steps:

providing a compound D and a compound E with following structural formulas:

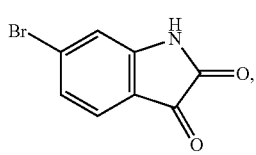

In the condition of HCl, applying HAc as solvent, mixing compounds D and E for reaction, then obtaining compounds F with the following structural formula:

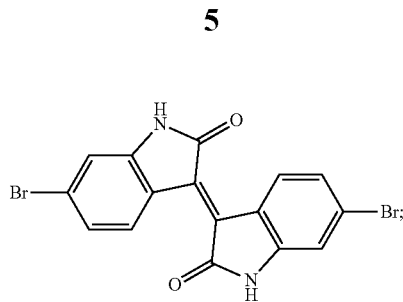

under anaerobic conditions, and with the presence of $K_2CO_3$, applying N,N-dimethyl formamide as solvent, mixing compounds F and Br—$R^1$ for reaction, obtaining the compound A;

wherein, Br—$R^1$ represents alkyl bromides;

$R^1$ represents $C_8$ to $C_{20}$ alkyl;

the reaction equation is:

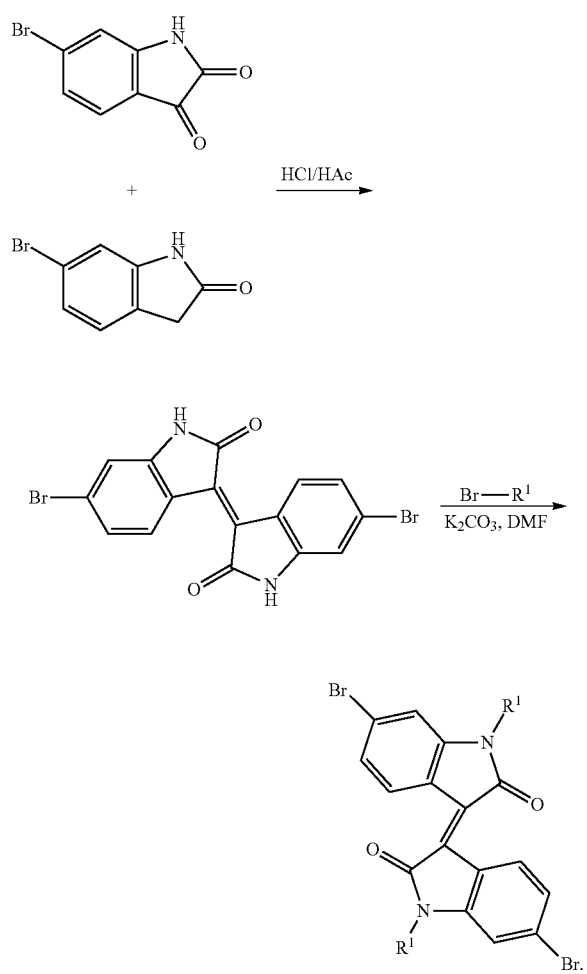

Preferably, the compound Ar is prepared by the following steps:

providing a compound B selected one from the group consisting of

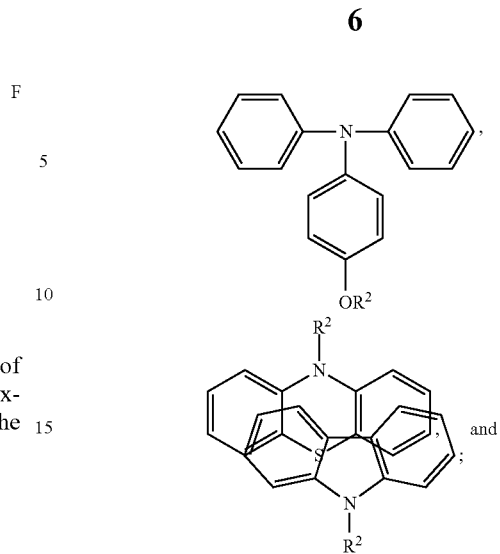

wherein $R^2$ represents $C_1$ to $C_{12}$ alkyl;

In the condition of ice bath, adding $POCl_3$ into N,N-dimethyl formamide to obtain a mixture, then adding a 1,2-dichloroethane solution of compound B into the mixture for reaction, getting a compound C selected one from the group consisting of:

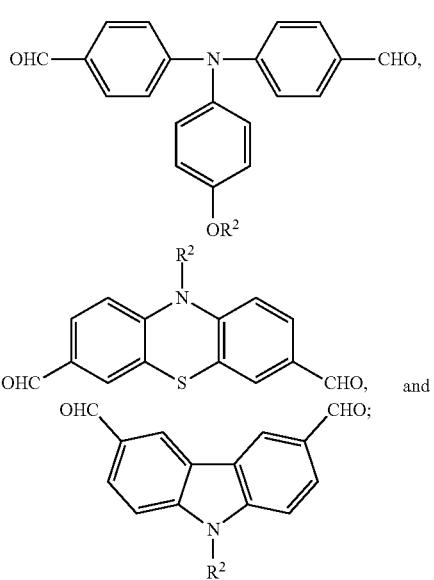

under anaerobic conditions, mixing t-BuOK and $CH_3PPh_3Br$ or mixing NaH and $CH_3PPh_3Br$ to get a mixed liquid, then adding a tetrahydrofuran solution of compound C into the mixed liquid for reaction, obtaining compound Ar respectively.

Preferably, the method further comprising the step of purifying the conjugated polymer P, which is, adding the conjugated polymer P into a methanol solution for precipitation, filtering and collecting the precipitate; orderly washing the precipitate by methanol and hexane, and dissolving in chloroform; gathering chloroform solution for rotary evaporation, then obtaining the purification of the conjugated polymer P.

A organic solar cells device, comprising a substrate, a conductive layer depositing on the surface of the substrate, an active layer coated on the conductive layer, and a metal aluminum cathode layer arranged on the active surface, in which the material of electron donor is made by the conjugated polymer P as foresaid.

An organic electroluminescent device, comprising a substrate, a conductive layer depositing on the surface of the substrate, a luminescent layer coated on the conductive layer, a buffer layer vapor deposited on the luminescent layer, and a metal aluminum cathode layer arranged on the buffer layer, in which the material of the luminescent layer is made by the conjugated polymer P as foresaid.

An organic field-effect transistor, comprising the sequentially laminated structure of an insulation layer, an organic semiconductor layer, a source electrode and a drain electrode compartmentally arranged on the organic semiconductor layer, in which the material of the organic semiconductor layer is made by the conjugated polymer P as foresaid.

The conjugated polymer containing isoindigo units as provided in the present invention has good solubility and film-forming property, as well as high thermal stability. HOMO and LUMO energy level are regulated effectively; the absorption range is broadened; and the energy conversion efficiency is greatly improved.

BRIEF DESCRIPTION OF THE DRAWINGS

Various embodiments of the present invention are described, by way of example only, with reference to the drawings, in which identical or related structures, elements, or parts may be labeled with the same reference numerals throughout the figures. Dimensions of components and features shown in the figures are generally chosen for convenience and clarity of presentation and are not necessarily to scale.

Figure 2:
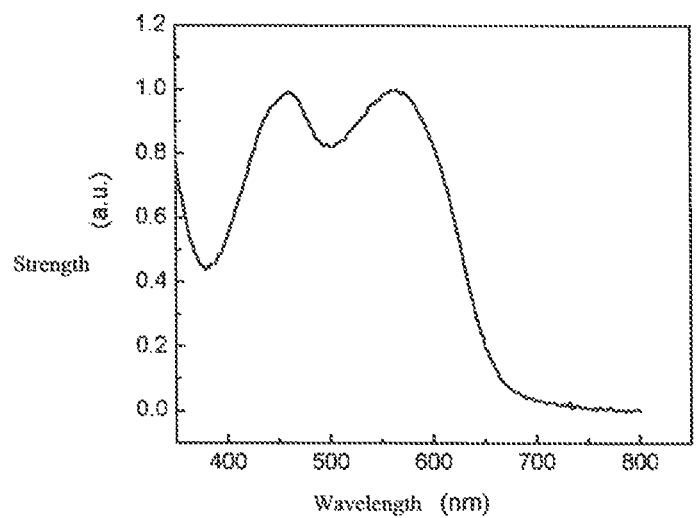
Figure 3:
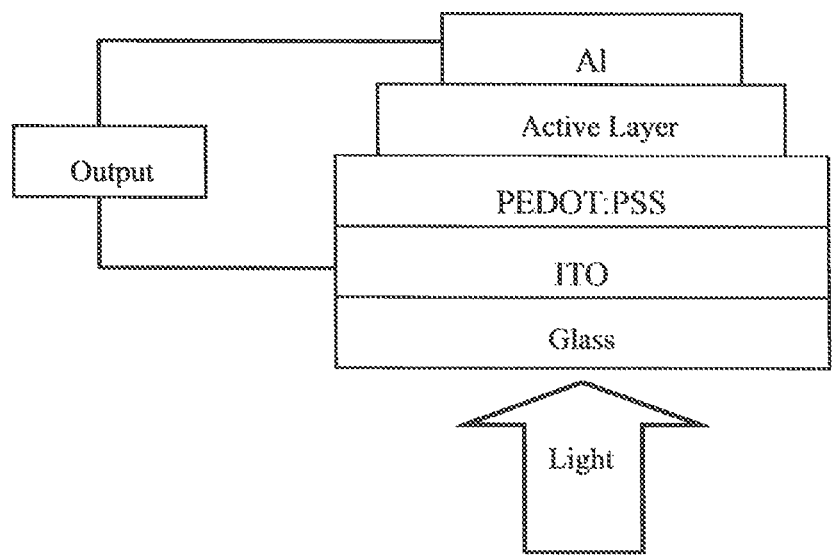

FIG. 1 shows a flow chart of the method of preparing a conjugated polymer containing isoindigo units according to one embodiment of present invention;

FIG. 2 shows an absorption spectrogram of prepared conjugated polymer containing isoindigo units according to example 2 of present invention;

FIG. 3 shows a constructional drawing of the organic solar cells device according to one embodiment of present invention.

Figure 4:
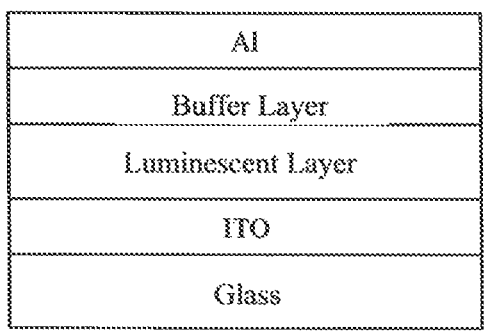

FIG. 4 shows a constructional drawing of the organic electroluminescent device according to one embodiment of present invention.

Figure 5:
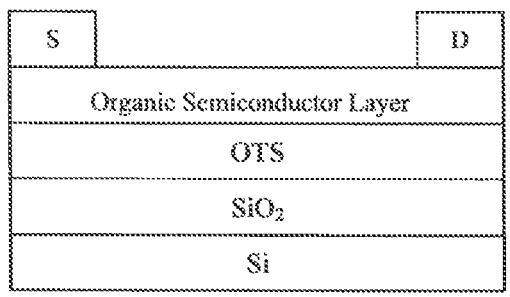

FIG. 5 shows a constructional drawing of the organic field-effect transistor according to one embodiment of present invention.

DETAILED DESCRIPTION

Various embodiments of the present invention are described, by way of example only, with reference to the drawings A conjugated polymer containing isoindigo units, having the structural formula as follow:

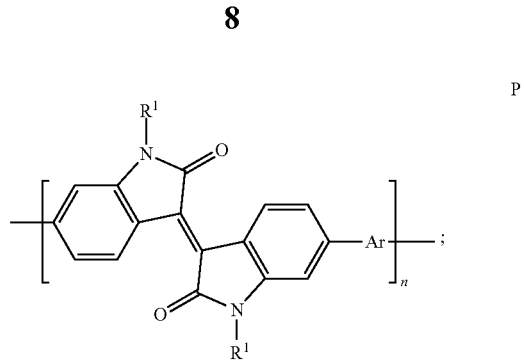

Ar is selected one from the group consisting of

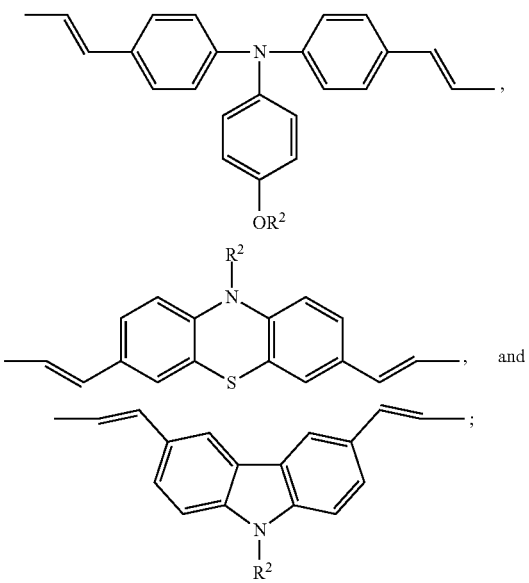

and $R^1$ represents $C_8$ to $C_{20}$ alkyl;
$R^2$ represents $C_1$ to $C_{12}$ alkyl;
n represents an integer from 2 to 50.

A method of preparing a conjugated polymer containing isoindigo units, as shows in FIG. 1, comprising the steps of, S1, preparing compound A with the following structure:

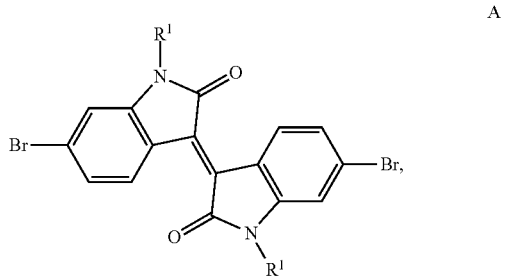

in which $R^1$ represents $C_8$ to $C_{20}$ alkyl.

First, providing a compound D and a compound E with following structural formulas:

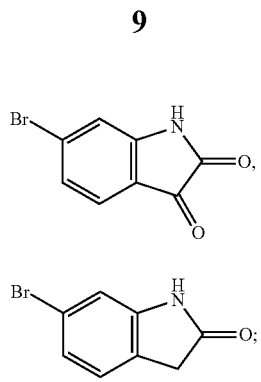

D

E

Then, introducing compound D, compound E, Glacial Acetic Acid (HAc) and a small quantity of Hydrochloric Acid (HCl) into a flask, heating and refluxing for 24 hours, cooling to room temperature, purifying, and getting a compound F with following structural formulas:

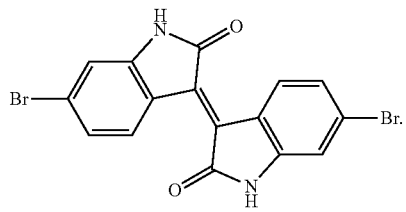

F

At last, under anaerobic conditions, putting compound F, $K_2CO_3$, N,N-dimethyl formamide (DMF, $(CH_3)_2NCHO$) and alkyl bromides Br—$R^1$ ($R^1$ represents $C_8$ to $C_{20}$ alkyl) into a three-necked flask, stirring at temperature about 100° C. and reaction for about 15 hours, purifying, and getting the desired compound A.

The whole reaction equation is:

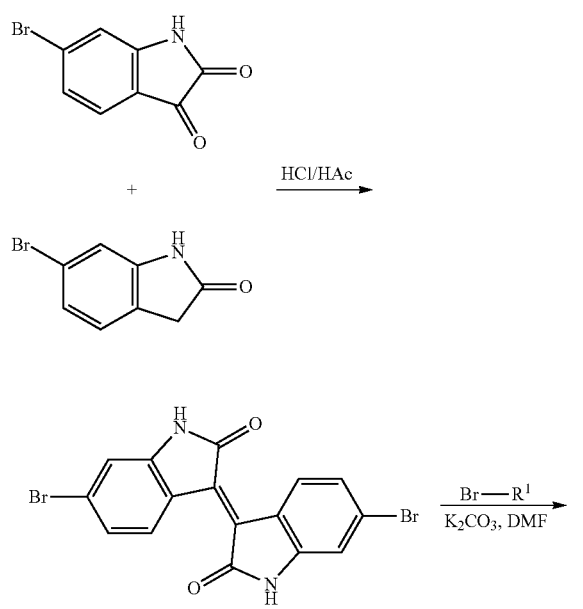

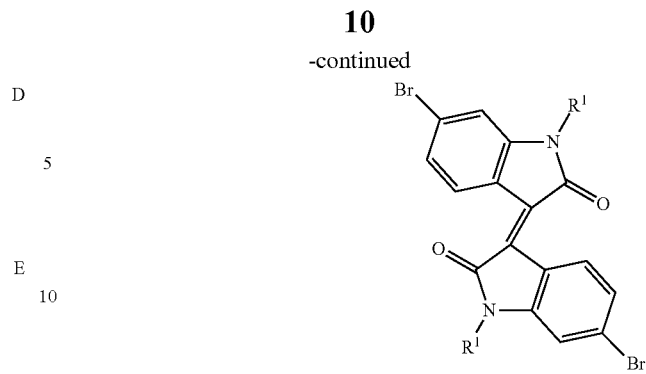

S2, preparing compound Ar compound Ar is selected one from the group consisting of

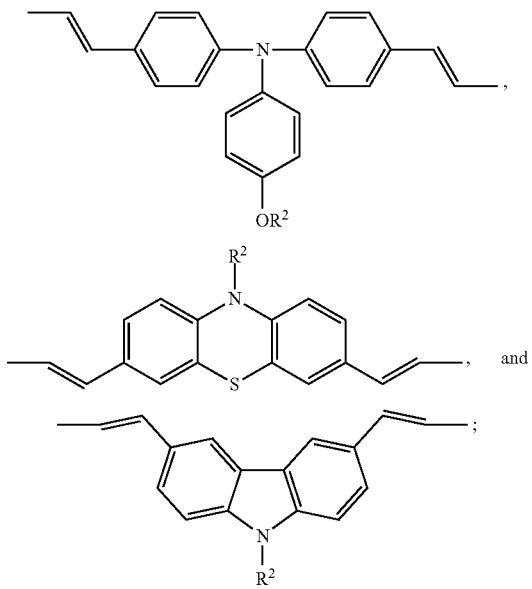

First, preparing a compound B selected one from the group consisting of

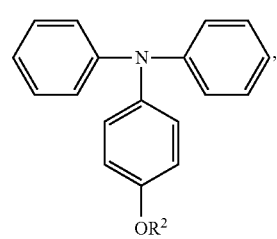

B

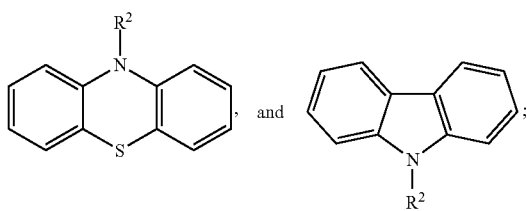

The reaction equation is:

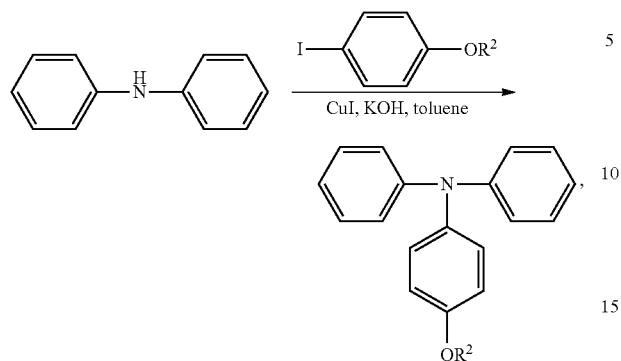

adding diphenylamine, 1-iodo-4-alkoxy benzene, Phenanthroline ($C_{12}H_8N_2 \cdot H_2O$), cuprous iodide (CuI) and potassium hydroxide (KOH) into toluene ($C_7H_8$), stirring at temperature about 100° C., refluxing for 36 hours, then cooling to room temperature, purifying, and getting the target product.

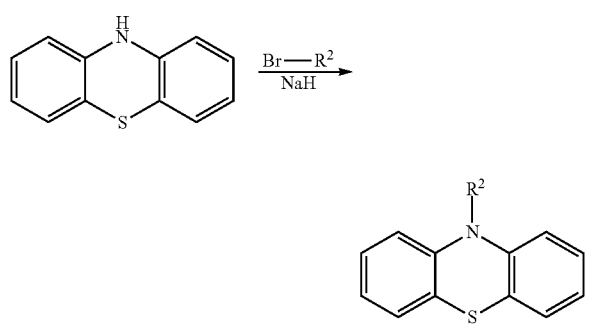

Adding phenothiazine, sodium hydride into N,N-dimethyl formamide, after stirring, then dropping alkyl bromides Br—$R^2$ ($R^2$ represents $C_1$ to $C_{12}$ alkyl) into the mixture, reacting for 2 hours and purifying, obtaining the product.

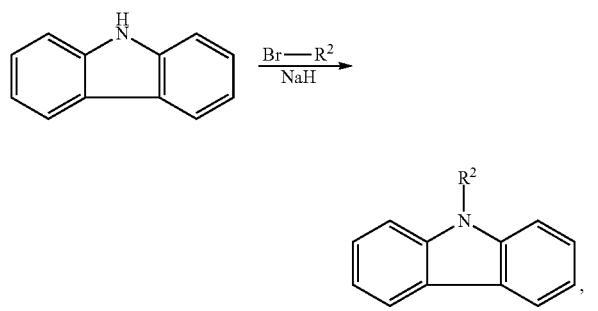

Adding carbazole, sodium hydride into N,N-dimethyl formamide, after stirring, then dropping alkyl bromides Br—$R^2$ ($R^2$ represents $C_1$ to $C_{12}$ alkyl) into the mixture, reacting for 2 hours and purifying, obtaining the product.

Then, with material compounds B, preparing compound C selected one from the group consisting of:

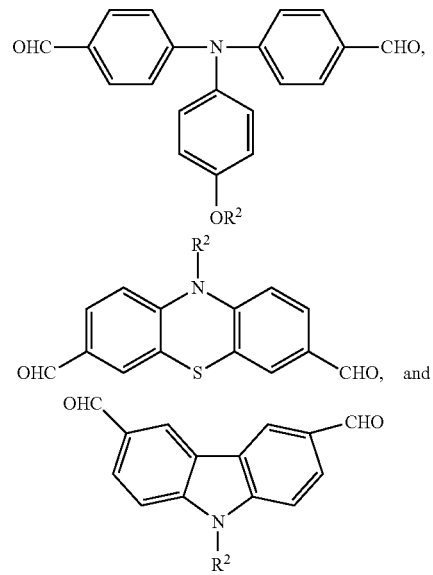

in the condition of ice bath, adding phosphorus oxychloride ($POCl_3$) into N,N-dimethyl formamide to obtain a mixture, then adding a 1,2-dichloroethane ($C_2H_4Cl_2$) solution of compound B into the mixture for reaction, getting the target compound C.

At last, preparing compound Ar by material compound C.

Under anaerobic conditions, mixing potassium tert-butoxide (t-BuOK) and methyl triphenylphosphonium bromide ($CH_3PPh_3Br$) or mixing sodium hydride (NaH) and $CH_3PPh_3Br$, to get a mixed liquid, then adding a tetrahydrofuran (THF, $C_4H_8O$) solution of compound C into the mixed liquid for reaction, after purification, obtaining the target compound Ar respectively.

Generally, anaerobic environment is provided by inert gas atmosphere or nitrogen atmosphere.

S3, preparing conjugated polymer containing isoindigo units

In an anaerobic environment, applying N,N-dimethyl formamide and triethylamine as organic solvent, in the presence of catalyst, mixing compound A and compound Ar with equal molar ratio, then at temperature of 90° C. to 110° C. for Heck reaction of 48 hours to 72 hours, to obtain the final product conjugated polymer P.

The reaction equation is:

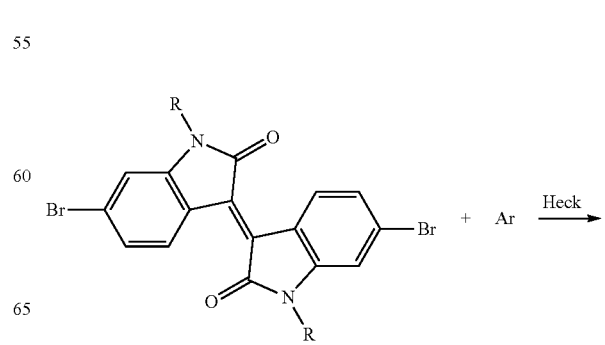

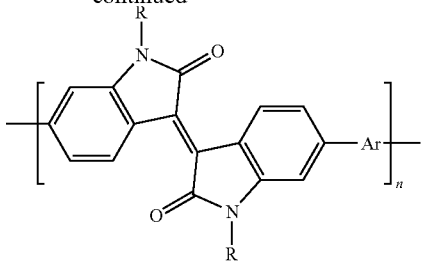

Usually, applying a mixture of organic palladium and organic phosphine ligand as catalyst, and the molar ratio between the organic palladium and organic phosphine ligand is 1:2 to 1:20.

Generally, organic palladium can be palladium acetate, and organic phosphine ligand is P(o-Tol)$_3$.

And the anaerobic environment can be provided by inert gas atmosphere or nitrogen atmosphere.

S4, purification of the conjugated polymer P

Adding the Heck reaction product into a methanol solution for precipitation, filtering and collecting the precipitate; then orderly washing the precipitate by methanol and hexane, and dissolving in chloroform; gathering chloroform solution for rotary evaporation, to obtain the purification of the conjugated polymer P.

After purification, conjugated polymer P can also dissolved with chloroform again, then collecting the solution after rotary evaporation, to improve the purity of it.

The conjugated polymer containing isoindigo units of this type has good solubility and film-forming property, as well as high thermal stability. HOMO and LUMO energy level are regulated effectively; the absorption range is broaden; and the energy conversion efficiency is greatly improved.

This kind of conjugated polymer containing isoindigo units has great application prospects in the field of organic solar cells device, organic electroluminescent device, and organic field-effect transistor.

Example 1

This example disclosed a conjugated polymer P1 with the following structural formula:

N,N-di(2-ethylhexyl)isoindigo-co-4-(octyloxy)-N,N-bis(4-vinylphenyl)aniline conjugated polymer The preparation processes are as follow:

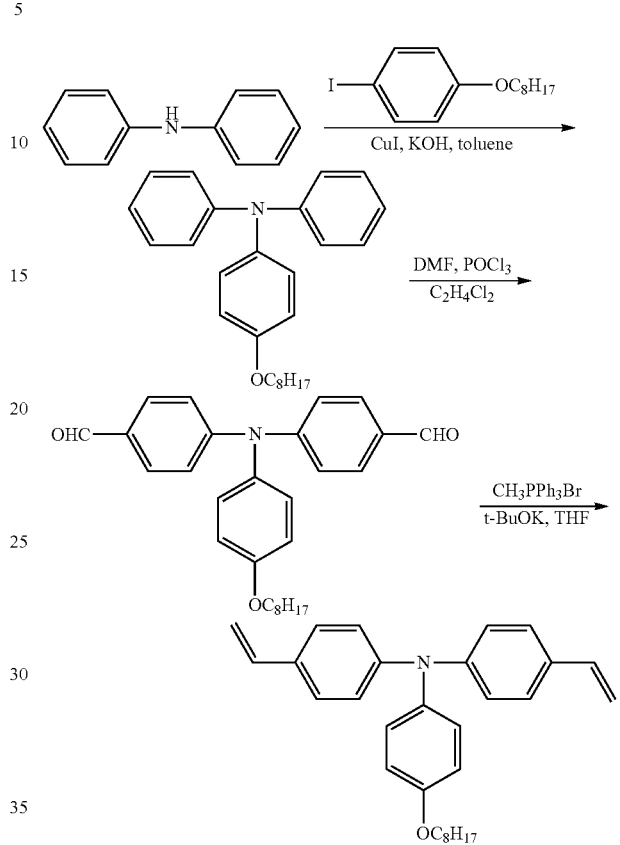

Preparation of 4-(octyloxy)-N,N-diphenylaniline

Adding diphenylamine (3.36 g, 20 mmol), 1-iodine-4-octyloxy benzene (18.9 g, 98.4 mmol), phenanthroline.H$_2$O (0.2 g), cuprous chloride (0.2 g) and potassium hydroxide (3.36 g, 60 mmol) into toluene (50 mL), mixing at tempera-

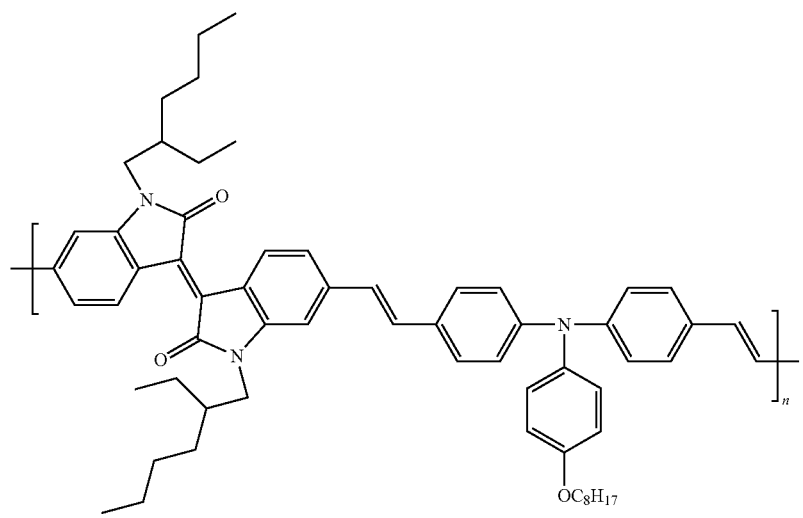

ture of 100° C. Refluxing for 36 hours and cooling to room temperature, evaporation to eliminate solvent, washing by dilute hydrochloric acid and water for three times, then chloroform extraction. After that, combining organic phase and washing by diluted NaCl solution and water for two times, and then drying by anhydrous magnesium sulfate and filtering, evaporating the solvent, using petroleum ether/dichloromethane (8:1, v/v) as eluent to elutriate the remainder, separating by silica gel column chromatography to obtain a colorless oily liquid, the yield was 65%.

$^1$H NMR (300 MHz, CDCl$_3$): 7.30-6.77 (m, 14H), 3.93 (t, 2H), 1.78-1.25 (m, 12H), 0.90 (t, 3H).

Preparation of 4,4'-(4-(octyloxy)phenylazanediyl) dibenzaldehyde

Putting a flask that contains N,N-dimethyl formamide and triethylamine (4.4 mL, 52.8 mmol) on ice bath, rapid stirring and slowly dropping Phosphorus oxychloride (4.4 mL, 48 mmol) into it, after that, heating to room temperature to generate yellow mucus. Then, slowly adding the 1,2-dichloroethane solution (50 mL) of compound 3 (1.79 g, 4.8 mmol) into the orange mucus, refluxing and reacting for 24 hours. After the reaction, slowly pouring the generated black mucus into ice water, chloroform extracting for three times. then combining organic phase and washing by water for two times, and then drying by anhydrous magnesium sulfate; evaporating the solvent, using petroleum ether/dichloromethane (1:1, v/v) as eluent to elutriate the remainder, separating by silica gel column chromatography to obtain a colorless oily liquid, the yield was 64%.

$^1$H NMR (300 MHz, CDCl$_3$): 9.87 (s, 2H), 7.77 (d, 4H), 7.15 (d, 4H), 7.10 (d, 2H), 6.9 (d, 2H), 3.93 (t, 2H), 1.85-1.30 (m, 12H), 0.91 (t, 3H).

Preparation of 4-(octyloxy)-N,N-bis(4-vinylphenyl)aniline

Under the protection of nitrogen, mixing methyl triphenylphosphonium bromide (2.15 g, 6 mmol) and potassium tert-butoxide (0.672 g, 6 mmol) and putting into a flask, then pouring in 50 mL of tetrahydrofuran (THF) and stirring for 10 min. After that, dissolving the compound 4 (0.858 g, 2 mmol) into 10 mL of THF and pouring into the reaction flask, stirring to reflux for 5 hours at 70° C. When cooled to room temperature, stop stirring, filtering the white mixture and distilling the filtrate to eliminate solvent. Using petroleum ether as eluent to elutriate the remaining colorless liquid, separating by silica gel column chromatography to obtain a colorless oily liquid, the yield was 49%.

$^1$H NMR (300 MHz, CDCl$_3$): 7.28 (d, 4H), 7.07 (d, 2H), 7.01 (d, 4H), 6.85 (d, 2H), 6.65 (q, 2H), 5.64 (q, 2H), 5.15 (d, 2H), 3.95 (t, 2H), 1.81-1.30 (t, 12H), 0.91 (t, 3H).

Preparation of 6,6'-bidromo-N,N'-dialkyl isoindigo

According to the method disclosed in Macromolecules, 2010, DOI: 10.1021/ma1018445, preparing the corresponding product. Exampled by the preparation of 6,6'-bidromo-N, N'-di(2-ethylhexyl)isoindigo, the processes are as follow:

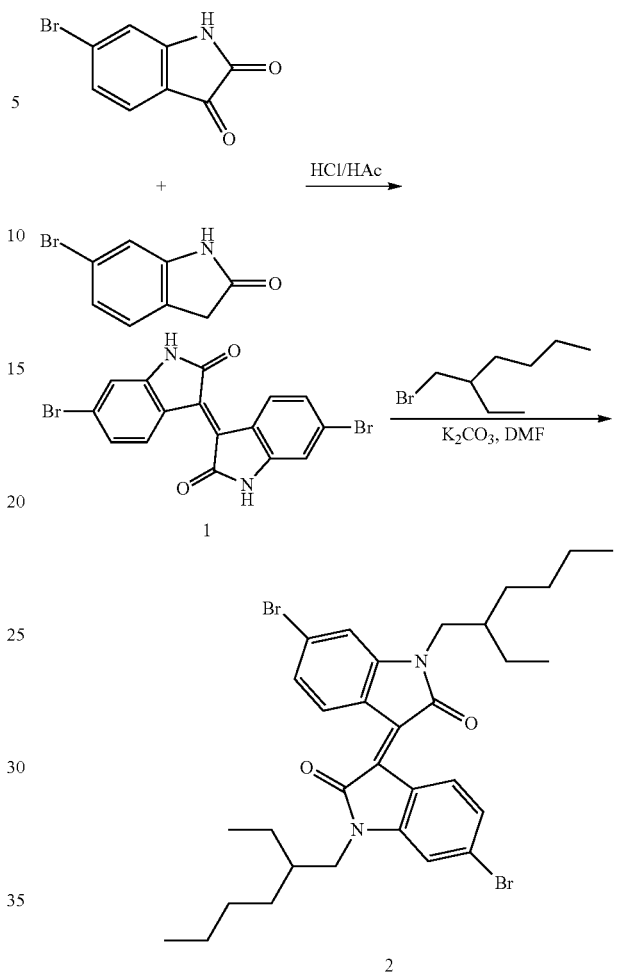

Preparation of 6,6'-bidromo isoindigo 1

Separately adding 6-brome indolone (500 mg, 2.36 mmol), 6-bromoisatin (533 mg, 2.36 mmol of isatin), 15 mL glacial acetic acid and 0.1 mL HCl into a flask, heating and refluxing for 24 hours. Stop the reaction and cooling to room temperature, filtering to obtain a solid, and then washing the solid by water, ethanol, and ethyl acetate. Drying the final product in a vacuum drying box, get brown 6,6'-bidromo isoindigo, the yield was 95%.

$^1$H NMR (300 MHz, CDCl$_3$): 10.7 (bs, 2H), 9.14 (d, 2H), 7.22-7.15 (m, 4H).

Preparation of 6,6'-bidromo-N,N'-bi(2-ethylhexyl) isoindigo 2

Under the protection of nitrogen, adding 6,6'-bidromo isoindigo (420 mg, 1 mmol), potassium carbonate (829 mg, 5 mmol), 20 mL N,N-dimethyl formamide and 1-bromo-2-ethyl hexane (425 g, 2.2 mmol) into a three-necked flask, mixturing at 100° C. and stirring for 15 hours. Stop the reaction and cooling to room temperature, pouring the mixture into 100 mL of water, extracting the organic phase with dichloromethane, and washing by saturated salt water, and then drying the organic phase by anhydrous magnesium sulfate, rotary evaporation of the solvent. Using dichloromethane/hexane (1:1) as eluent to elutriate the crude product, separating by silica gel column chromatography to obtain a dark red solid 2, the yield was 85%.

$^1$H NMR (300 MHz, CDCl$_3$): 9.00 (d, 2H), 7.13 (dd, 2H), 6.81 (d, 2H), 3.60-3.48 (m, 4H), 1.90-1.72 (m, 2H), 1.43-1.20 (m, 16H), 0.95-0.82 (m, 12H).

Preparation of Conjugated Polymer P1

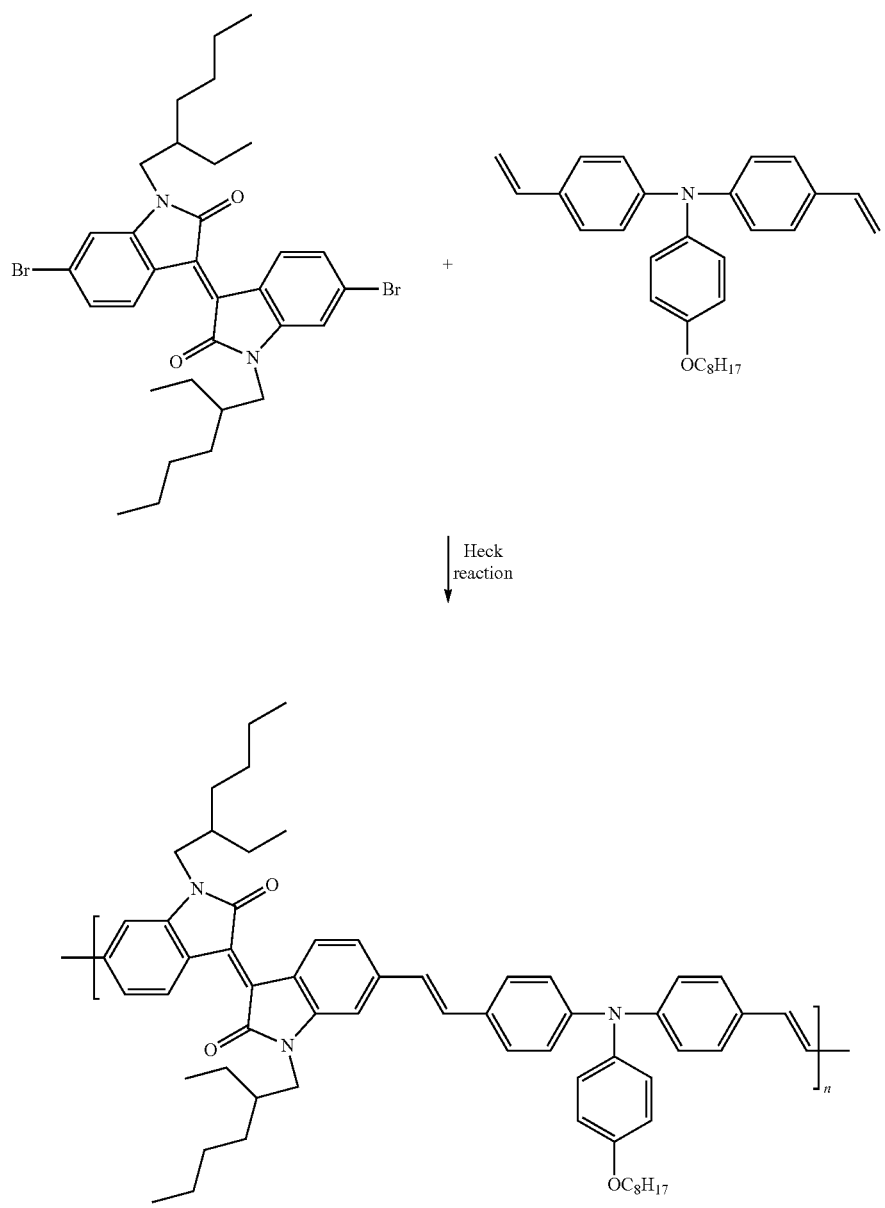

Under the protection of nitrogen, adding the monomer 6,6'-bidromo-N,N'-bi(2-ethylhexyl) isoindigo (322 mg, 0.5 mmol) and 4-(octyloxy)-N,N-bis(4-vinylphenyl)aniline (212.5 mg, 0.5 mmol) together with catalyst Pd(OAc)$_2$ (4.5 mg, 0.02 mmol), P(o-tol)$_3$ (37 mg, 0.12 mmol) into a 50 mL of two-necked flask. Pouring in N,N-dimethyl formamide (6 mL) and triethylamine (2 mL). Then filling in nitrogen and exhausting air for about 20 min, and then reacting at 110° C. for 48 hours. Cooling and cease the reaction, adding 50 mL of methanol into the flask for precipitation, filtering by Soxhlet Extractor (also called as fat extractor) and then extracting by methanol and n-hexane for 24 hours. Then extracting by chloroform to colorless, collecting the chloroform solution and rotary drying to get dark red solid P1, collecting and drying under vacuum for 24 hours to obtain the polymer, the yield was 62%. Molecular weight (GPC, THF, R., I): Mn=26200, Mw/Mn=2.3).

Example 2

This example disclosed a conjugated polymer P2 with the following structural formula:

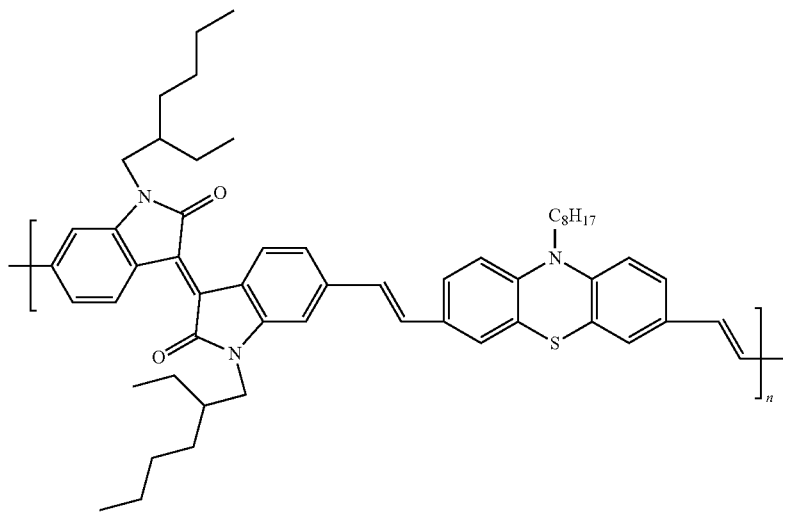

N,N'-di(2-ethylhexyl)isoindigo-co-3,7-divinyl-N-n-octyl-phenothiazine conjugated polymer The preparation processes are as follow:

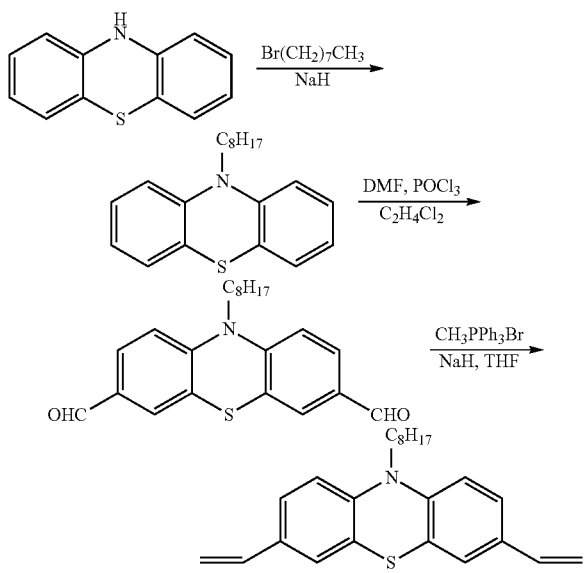

Preparation of N-n-octyl-phenothiazine

Adding phenothiazine (5 g, 25 mmol), sodium hydride (1.8 g) into the N,N-dimethyl formamide (30 mL), stirring, and then dropping n-octyl bromide (5.4 g, 28 mmol) into the mixture. Cease reaction after 2 hours, putting the mixture into 300 mL distilled water for, extracting by n-hexane, rotary evaporation of the solvent, using n-hexane as eluent to elutriate the crude product, then separating by silica gel column chromatography to obtain a yellow sticky product, the yield was 81%.

$^1$H NMR (300 MHz, CDCl$_3$): 0.98 (t, 3H), 1.37 (m, 8H), 1.51 (m, 2H), 1.88 (m, 2H), 3.90 (t, 2H), 6.93 (d, 2H), 6.98 (t, 2H), 7.21 (t, 4H).

Preparation of 3,7-dicarbaldehyde-N-n-octyl-phenothiazine

Putting the flask which filled in with N,N-dimethyl formamide (30 mL) on ice bath, rapid stirring and slowly dropping phosphorus oxychloride (40 g, 0.26 mol) into it, after that, heating to room temperature to generate a yellow mucus. Then, slowly adding the 1,2-dichloroethane solution (26 mL) of compound 6 (4 g, 13 mmol) into the yellow mucus for reflux reaction for 48 hours. Once the reaction finished, slowly pouring the generated black mucus into ice water, and extracting by chloroform for three times. Then combining organic phase, washing by water for two times, and drying by anhydrous magnesium. Evaporating the solvent, using petroleum ether/dichloromethane (1:1, v/v) as eluent to elutriate the remainder, separating by silica gel column chromatography to obtain a colorless oily liquid, the yield was 33%.

$^1$H NMR (300 MHz, CDCl$_3$): 0.86 (t, 3H), 1.25-1.34 (m, 8H), 1.45 (m, 2H), 1.81 (m, 2H), 3.93 (t, 2H), 6.96 (d, 2H), 7.58 (s, 2H), 7.65 (d, 2H), 9.82 (s, 2H).

Preparation of 3,7-divinyl-N-n-octyl-phenothiazine

Under the protection of nitrogen, mixing methyl triphenylphosphonium bromide (5.2 g, 14.6 mmol) and NaH (0.8 g, 33.3 mmol) and putting into a flask, then pouring 70 mL of THF into the flask, stirring for 10 min. And then dissolving the compound 7 (2.2 g, 6 mmol) with 10 mL of THF and adding into the reaction flask, stirring and refluxing for 8 hours at 70° C. Cease stirring once cooled to room temperature, filtering the white mixture and distillation the filtrate to eliminate solvent. Using petroleum ether as eluent to elutriate the remainder, and separating by silica gel column chromatography to obtain a colorless oily liquid, the yield was 49%.

$^1$H NMR (300 MHz, CDCl$_3$): 0.86 (t, 3H), 1.08-1.43 (m, 8H), 1.78 (m, 4H), 3.81 (t, 2H), 5.14 (d, 2H), 5.62 (d, 2H), 6.54 (m, 2H), 6.78 (d, 2H), 7.17 (d, 2H).

Preparation of Conjugated Polymer P2

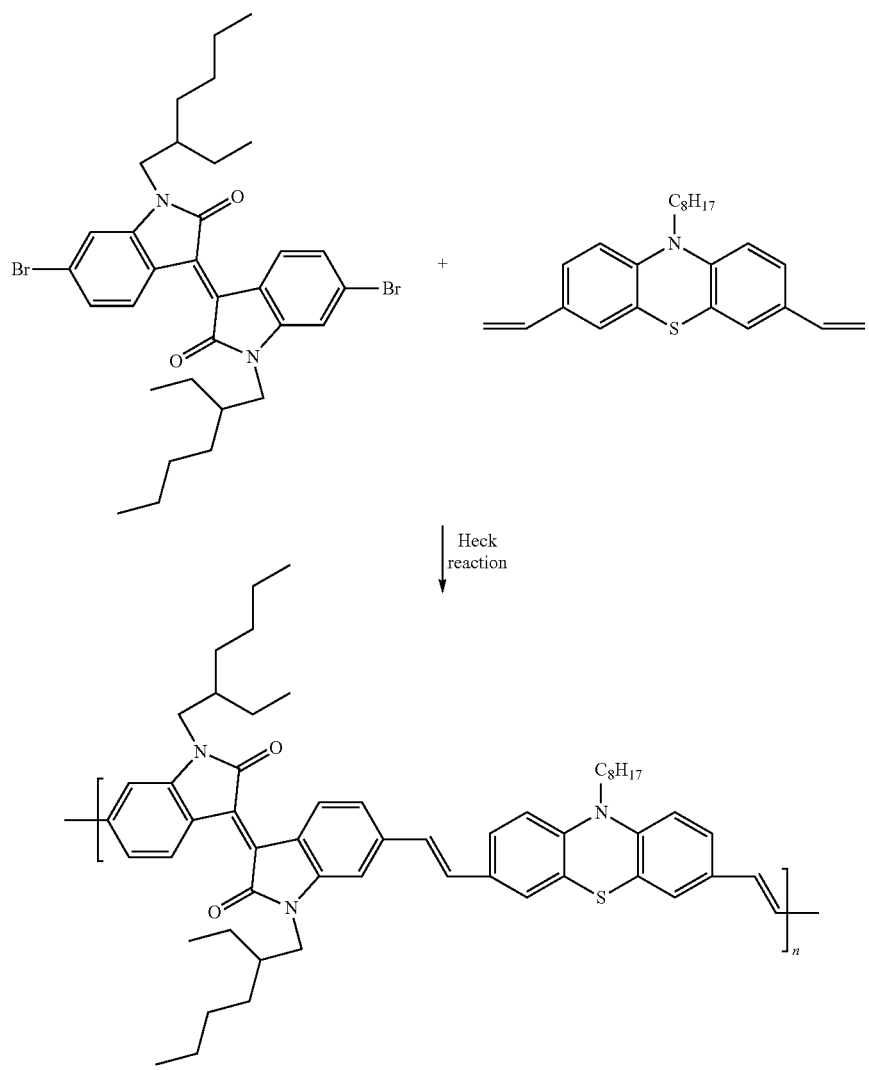

Under the protection of nitrogen, adding the monomer 6,6'-bidromo-N,N'-bi(2-ethylhexyl) isoindigo (322 mg, 0.5 mmol) and 3,7-divinyl-N-n-octyl-phenothiazine (181.5 mg, 0.5 mmol) together with catalyst Pd(OAc)$_2$ (4.5 mg, 0.02 mmol), P(o-tol)$_3$ (37 mg, 0.12 mmol) into a 50 mL of two-necked flask. Pouring in N,N-dimethyl formamide (6 mL) and triethylamine (2 mL). Then filling in nitrogen and exhausting air for about 20 min, reacting at 90° C. for 24 hours and then reacting at 110° C. for another 24 hours. Cooling and cease the reaction, adding 50 mL of methanol into the flask for precipitation, filtering by Soxhlet Extractor (also called as fat extractor) and then extracting by methanol and n-hexane for 24 hours. Then extracting by chloroform to colorless, collecting the chloroform solution and rotary drying to get dark red solid P2, collecting and drying under vacuum for 24 hours to obtain the polymer, the yield was 56%. Molecular weight (GPC, THF, R., I): Mn=28900, $M_w/M_n$=2.2)

Absorption spectra of the conjugated polymer P2 containing isoindigo unit was shown in FIG. 2, it can be seen that the conjugated polymer P2 has strong absorption peaks at the wavelength of 450 nm.

Example 3

This example disclosed a conjugated polymer P3 with the following structural formula:

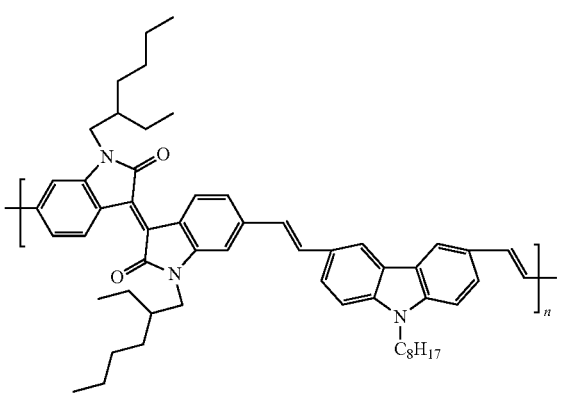

N,N'-di(2-ethylhexyl)isoindigo-co-3,6-divinyl-N-n-octyl-carbazole conjugated polymer
Preparation of 3,6-divinyl-N-n-octyl-carbazole
Similar with the preparation of 3,7-divinyl-N-n-octyl-phenothiazine in example 2, replacing phenothiazine with carbazole, and the reaction equation is as follow:
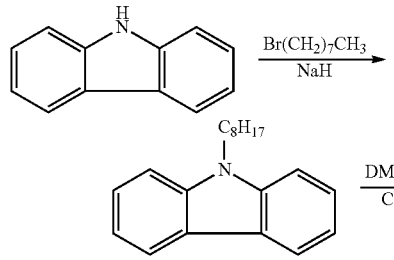
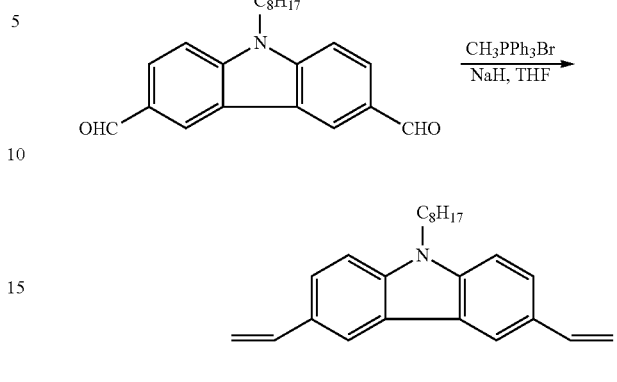
Preparation of Conjugated Polymer P3
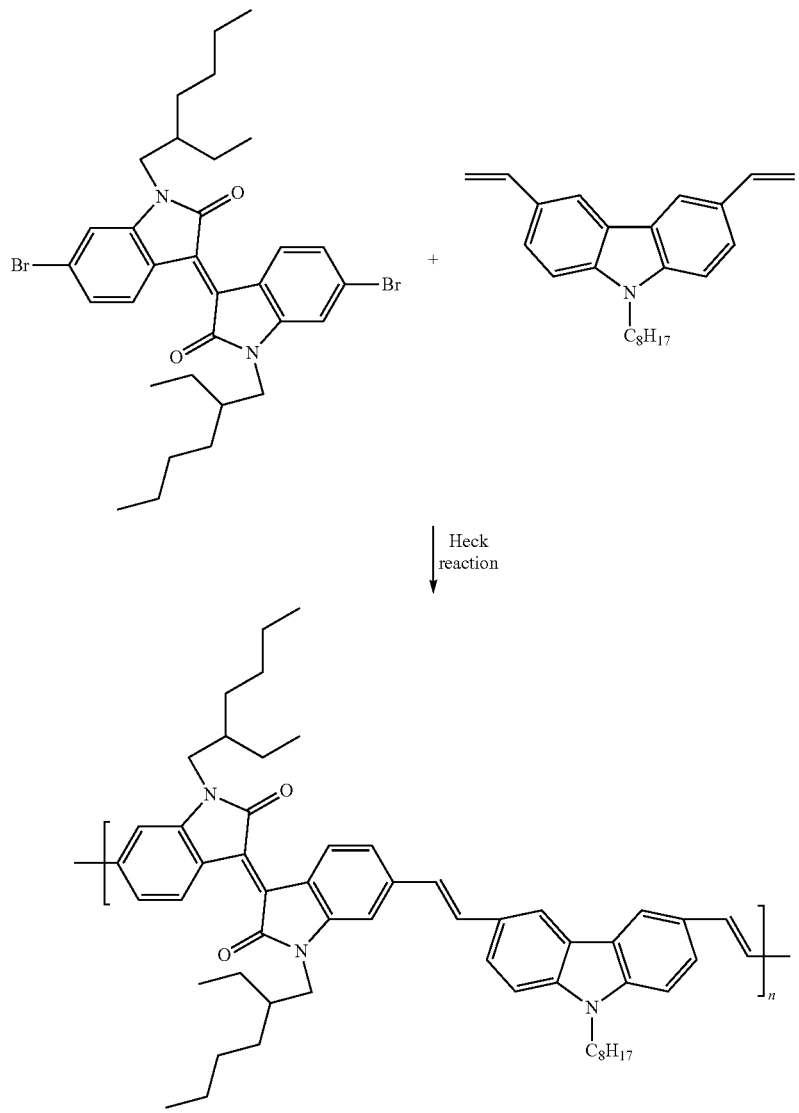

Under the protection of nitrogen, adding the monomer 6,6'-bidromo-N,N'-bi(2-ethylhexyl)isoindigo (322 mg, 0.5 mmol) and 3,6-divinyl-N-n-octyl-carbazole (165.5 mg, 0.5 mmol) together with catalyst Pd(OAc)$_2$ (4.5 mg, 0.02 mmol), P(o-tol)$_3$ (37 mg, 0.12 mmol) into a 50 mL of two-necked flask. Pouring in N,N-dimethyl formamide (6 mL) and triethylamine (2 mL). Then filling in nitrogen and exhausting air for about 20 min, reacting at 100° C. for 24 hours and then reacting at 110° C. for another 24 hours. Cooling and cease the reaction, adding 50 mL of methanol into the flask for precipitation, filtering by Soxhlet Extractor (also called as fat extractor) and then extracting by methanol and n-hexane for 24 hours. Then extracting by chloroform to colorless, collecting the chloroform solution and rotary drying to get dark red solid P3, collecting and drying under vacuum for 24 hours to obtain the polymer, the yield was 42%. Molecular weight (GPC, THF, R., I): Mn=24600, $M_w/M_n$=2.6)

Example 4

A organic solar cells device has the structure as shown in FIG. 3. ITO glass (indium tin oxide glass) is applied in this embodiment, namely, using glass as substrate, ITO (indium tin oxide) as a conductive layer, conjugated polymer is the conjugated polymer P1 as in the foresaid example 1.

The structure of the organic solar cells device is: Glass/ITO/PEDOT:PSS/Active layer/A1. In which the material of active layer is a mixture that containing [6,6]phenyl-$C_{61}$-methyl butyrate as the material of electron donor, and conjugated polymer P1 provided in the foresaid example 1 as the material of electron acceptor. The ITO has a sheet resistance of 10Ω to 20Ω, the PEDOT is poly(3,4-ethylenedioxythiophene) and the PSS is poly(styrenesulfonate).

The preparation processes of the organic solar cells device are as follow:

After ultrasonic cleaning the ITO glass and treatment by Oxygen-Plasma, coating on the surface of ITO with a layer of PEDOT:PSS for modification.

Coating an active layer on the PEDOT:PSS layer by applying spin coating technique, the material of the active layer including [6,6]phenyl-$C_{61}$-methyl butyrate as electron donor, and conjugated polymer P1 as electron acceptor.

Vacuum evaporating Aluminum on the surface of active layer, to form a layer of metal aluminum as cathode layer, and get the organic solar cells devices. In this embodiment, thickness of metal aluminum layer is 170 nm; in other embodiments, the thickness of metal aluminum layer can also be 30 nm, 130 nm, and 60 nm.

In this embodiment, the organic solar cells be put into the airtight condition of 110° C. for 4 hours, then cooling to room temperature, by annealing, it can effectively increase the order and regularity of the arrangement between the groups and chain segments of the molecular within the device, and improve transmission speed and efficiency of carrier mobility, thus to improve the photoelectric conversion efficiency.

Example 5

An organic electroluminescent device, has the structure as shown in FIG. 4, ITO glass (indium tin oxide glass) is applied in this embodiment, namely, using glass as substrate, ITO (indium tin oxide) as a conductive layer, conjugated polymer is the conjugated polymer P2 as in the foresaid example 2.

The structure of the organic electroluminescent device is: Glass/ITO/Luminescent layer/Buffer layer/A1. In which the material of luminescent layer is the conjugated polymer P2 provided in the foresaid example 2; the material of buffer layer is LiF. The ITO has a sheet resistance of 10Ω to 20Ω, the PEDOT is poly(3,4-ethylenedioxythiophene) and the PSS is poly(styrenesulfonate).

The preparation processes of the organic electroluminescent device are as follow:

After ultrasonic cleaning the ITO glass and treatment by Oxygen-Plasma, coating on the surface of ITO with a layer of conjugated polymer P2 provided in the foresaid example 2 to form the luminescent layer.

Vacuum evaporating a layer of LiF on the luminescent material to form the buffer layer.

Vacuum evaporating Aluminum on the surface of buffer layer, to form a layer of metal aluminum as cathode layer, and get the organic electroluminescent devices. In this embodiment, thickness of metal aluminum layer is 170 nm; in other embodiments, the thickness of metal aluminum layer can also be 30 nm, 130 nm, and 60 nm.

Example 6

An organic field-effect transistor, has the structure as shown in FIG. 5, high doped silicon wafer is applied in this embodiment as substrate, conjugated polymers is the conjugated polymer P3 as in the foresaid example 3.

The structure of the organic field-effect transistor is: Si/SiO$_2$/OTS/Organic Semiconductor layer/Source Electrode (S) and Drain Electrode (D). In which the thickness of SiO$_2$ is about 500 nm for insulation; the OTS is octadecyl trichlorosilane, the material of organic semiconductor layer is the conjugated polymer P3 provided in the foresaid example 3; the source electrode (S) and drain electrode (D) are made of metal Aurum.

The preparation processes of the organic field-effect transistor are as follow:

Cleaning the doped silicon wafer substrate, depositing SiO$_2$ layer for insulation;

Coating OTS on the SiO$_2$ insulation layer to form the OTS layer;

Coating a layer of conjugated polymer P3 as provided in the foresaid example 3, to form the organic semiconductor layer;

Setting the metal Aurum made source electrode and drain electrode on the organic semiconductor layer, to obtain the organic field-effect transistor.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A conjugated polymer containing isoindigo units, having the structural formula as follow:

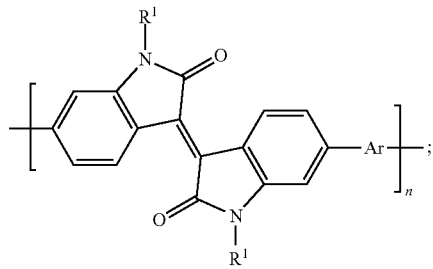

wherein, Ar is selected one from the group consisting of

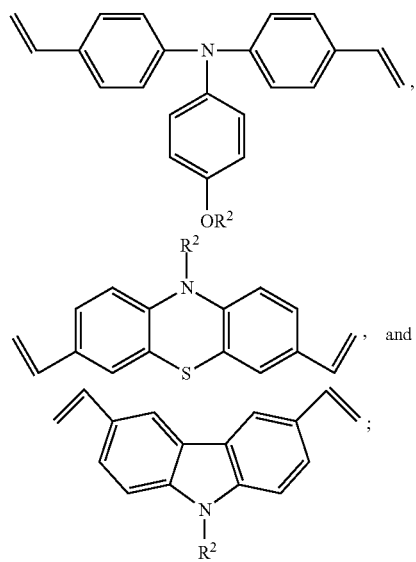

$R^1$ represents $C_8$ to $C_{20}$ alkyl;
$R^2$ represents $C_1$ to $C_{12}$ alkyl;
n represents an integer from 2 to 50.

2. A method of preparing a conjugated polymer containing isoindigo units, comprising the steps of, providing a compound A with the following structure:

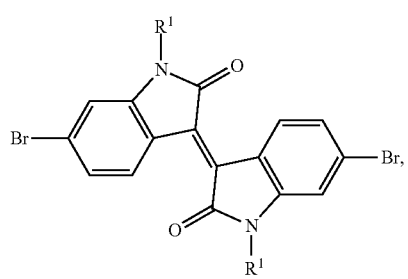

and compound Ar is selected one from the group consisting of

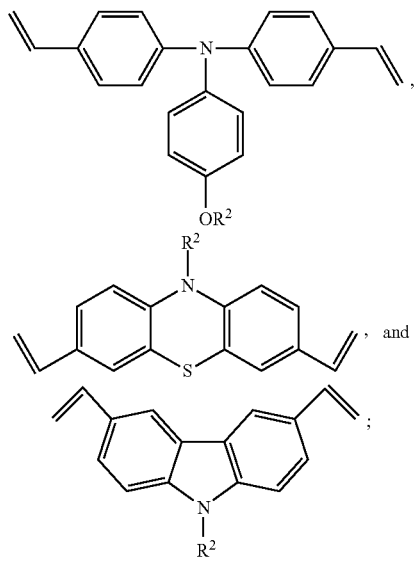

wherein $R^1$ represents $C_8$ to $C_{20}$ alkyl, $R^2$ represents $C_1$ to $C_{12}$ alkyl, n represents an integer from 2 to 50;

in an anaerobic environment, applying a mixture of organic palladium and organic phosphine ligand as catalyst, and the molar ratio between the organic palladium and organic phosphine ligand is 1:2 to 1:20; mixing compound A and compound Ar in organic solvent for Heck reaction, then obtaining a conjugated polymers containing isoindigo units with the following structural formula:

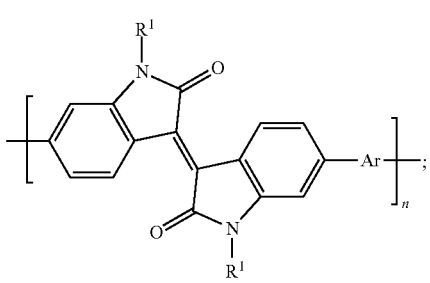

wherein, Ar is selected one from the group consisting of

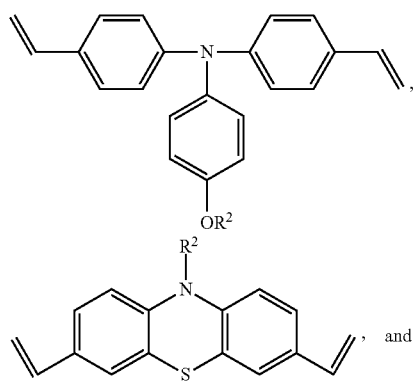

-continued

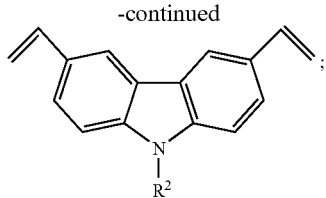

$R^1$ represents $C_8$ to $C_{20}$ alkyl; $R^2$ represents $C_1$ to $C_{12}$ alkyl; n represents an integer from 2 to 50;

the reaction equation is:

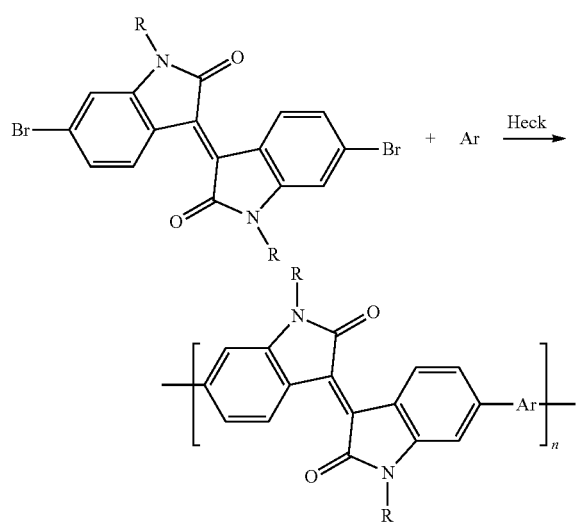

3. The method as in claim 2, wherein the organic solvent is a mixture of N,N-dimethyl formamide and triethylamine;

the organic palladium is palladium acetate;

the organic phosphine ligand is P(o-Tol)$_3$.

4. The method as in claim 2, wherein the condition of Heck reaction is at temperature from 90° C. to 110° C. and reacting for 48~72 hours.

5. The method as in claim 2, wherein the compound A is prepared by the following steps:

providing a compound D and a compound E with following structural formulas:

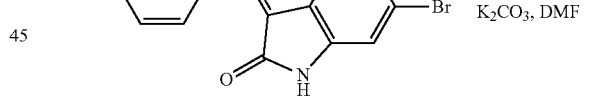

in the condition of HCl, applying HAc as solvent, mixing compounds D and E for reaction, then obtaining compounds F with the following structural formula:

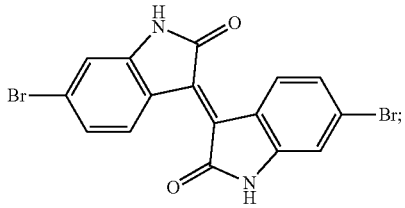

under anaerobic conditions, and with the presence of K$_2$CO$_3$, applying N,N-dimethyl formamide as solvent, mixing compounds F and Br—R$^1$ for reaction, obtaining the compound A;

wherein, Br—R' represents alkyl bromides;

R$^1$ represents $C_8$ to $C_{20}$ alkyl;

the reaction equation is:

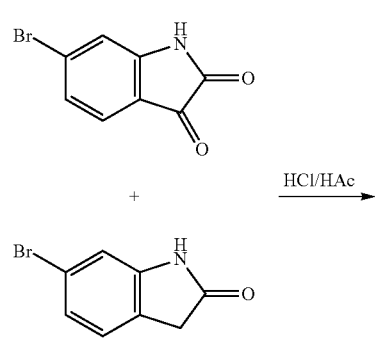

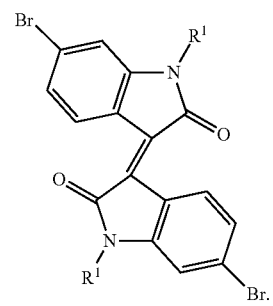

6. The method as in claim 2, wherein the compound Ar is prepared by the following steps:

providing a compound B selected one from the group consisting of

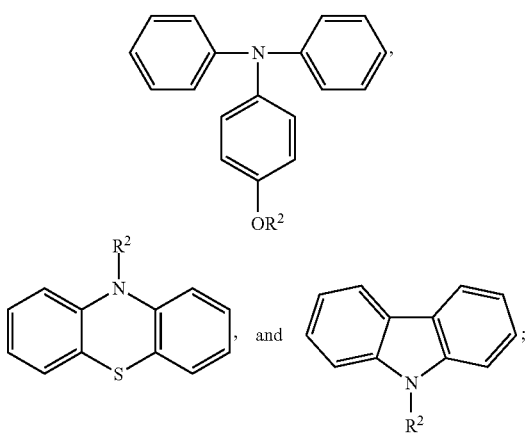

B

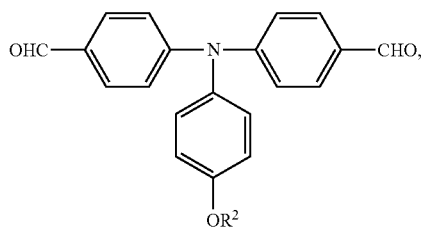

wherein $R^2$ represents $C_1$ to $C_{12}$ alkyl;

in the condition of ice bath, adding $POCl_3$ into N,N-dimethyl formamide to obtain a mixture, then adding a 1,2-dichloroethane solution of compound B into the mixture for reaction, getting a compound C selected one from the group consisting of:

C

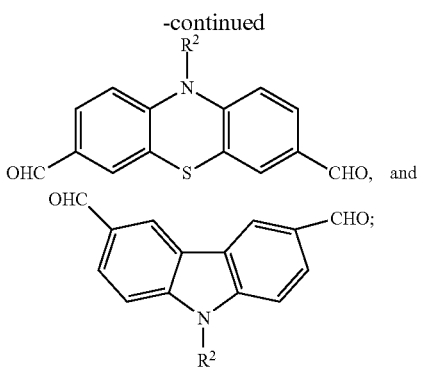

under anaerobic conditions, mixing t-BuOK and $CH_3PPh_3Br$ or mixing NaH and $CH_3PPh_3Br$ to get a mixed liquid, then adding a tetrahydrofuran solution of compound C into the mixed liquid for reaction, obtaining compound Ar respectively.

7. The method as in claim 2, further comprising the step of purifying the conjugated polymer P, wherein,
  adding the conjugated polymer P into a methanol solution for precipitation, filtering and collecting the precipitate; orderly washing the precipitate by methanol and hexane, and dissolving in chloroform; gathering chloroform solution for rotary evaporation, then obtaining the purification of the conjugated polymer P.

8. An organic solar cells device, comprising
  a substrate,
  a conductive layer depositing on the surface of the substrate,
  an active layer coated on the conductive layer, and
  a metal aluminum cathode layer arranged on the active surface,
  wherein the electron donor material is made by the conjugated polymer P as in claim 1.

* * * * *